(12) United States Patent
Butler et al.

(10) Patent No.: US 10,551,751 B2
(45) Date of Patent: Feb. 4, 2020

(54) LITHOGRAPHY APPARATUS AND DEVICE MANUFACTURING METHOD

(71) Applicant: ASML Netherlands B.V., Veldhoven (NL)

(72) Inventors: Hans Butler, Best (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/395,436

(22) PCT Filed: Mar. 18, 2013

(86) PCT No.: PCT/EP2013/055537
§ 371 (c)(1),
(2) Date: Oct. 17, 2014

(87) PCT Pub. No.: WO2013/160016
PCT Pub. Date: Oct. 31, 2013

(65) Prior Publication Data
US 2015/0098073 A1    Apr. 9, 2015

Related U.S. Application Data

(60) Provisional application No. 61/638,889, filed on Apr. 26, 2012.

(51) Int. Cl.
*G03B 27/58*    (2006.01)
*G03F 7/20*    (2006.01)
*G03F 9/00*    (2006.01)

(52) U.S. Cl.
CPC ......... *G03F 7/70775* (2013.01); *G03F 7/709* (2013.01); *G03F 7/7085* (2013.01); *G03F 7/70825* (2013.01); *G03F 9/7096* (2013.01)

(58) Field of Classification Search
CPC ............. G03F 7/70775; G03F 7/70825; G03F 7/70833; G03F 7/7085; G03F 7/70858;
(Continued)

(56) References Cited

U.S. PATENT DOCUMENTS 6,977,713 B2    12/2005    Luttikhuis et al.
7,072,025 B2    7/2006    Cox et al.
(Continued)

FOREIGN PATENT DOCUMENTS

CN    1627192    6/2005
CN    1839464    9/2006
(Continued)

OTHER PUBLICATIONS

Chinese Office Action dated Sep. 1, 2015 in Chinese Patent Application No. 201380022023.6.
(Continued)

*Primary Examiner* — Christina A Riddle
(74) *Attorney, Agent, or Firm* — Pillsbury Winthrop Shaw Pittman LLP (57) ABSTRACT

A lithography apparatus and device manufacturing methods are disclosed. A lithography apparatus includes a support stage, and a measurement system including a sensor part and a reference part, the measurement system being configured to determine the position and/or orientation of the support stage, or of a component mounted on the support stage, relative to a reference frame by using the sensor part to interact with the reference part, wherein: the reference frame comprises N sub-frames coupled together so as to behave predominantly as a single rigid body with respect to vibrations below a first reference frequency and predominantly as an N-body system with respect to vibrations above a second reference frequency, where N is an integer greater than 1.

20 Claims, 3 Drawing Sheets

(58) Field of Classification Search
CPC .... G03F 7/709; G03F 7/70975; G03F 9/7015; G03F 9/7096; G03F 7/70791; G03F 7/708; G03F 7/70808; G03F 7/70991; G01D 5/347
USPC ............ 355/52, 53, 55, 67–71, 72–77; 250/492.1, 492.2, 492.22, 493.1, 548
See application file for complete search history.

(56) References Cited

U.S. PATENT DOCUMENTS

| | | |
|---|---|---|
| 7,253,875 B1 | 8/2007 | Luttikhuis et al. |
| 7,483,120 B2 | 1/2009 | Luttikhuis et al. |
| 7,649,613 B2 | 1/2010 | Butler |
| 8,009,273 B2 | 8/2011 | Wada |
| 8,189,174 B2 | 5/2012 | Kruizinga et al. |
| 8,245,824 B2 | 8/2012 | Butler et al. |
| 8,619,232 B2 | 12/2013 | Butler et al. |
| 2005/0122490 A1 | 6/2005 | Luttikhuis et al. |
| 2005/0190351 A1 | 9/2005 | Cox et al. |
| 2006/0103944 A1 | 5/2006 | Ono et al. |
| 2007/0076310 A1* | 4/2007 | Sakino ............... G02B 7/183 359/819 |
| 2007/0206169 A1 | 9/2007 | Butler |
| 2007/0263197 A1 | 11/2007 | Luttikhuis et al. |
| 2008/0278702 A1* | 11/2008 | Van Der Pasch ... G03F 7/70516 355/53 |
| 2008/0319569 A1* | 12/2008 | Loopstra ............ G03F 7/70775 700/110 |
| 2009/0103066 A1 | 4/2009 | Butler et al. |
| 2009/0180092 A1* | 7/2009 | Butler ................... G03F 7/709 355/67 |
| 2009/0201484 A1* | 8/2009 | Arai .................... B82Y 10/00 355/72 |
| 2010/0128241 A1 | 5/2010 | Kruizinga et al. |
| 2010/0157264 A1* | 6/2010 | Butler ................... G03F 7/709 355/53 |
| 2011/0141449 A1* | 6/2011 | Seijger ............... G03F 7/70766 355/72 |
| 2011/0170078 A1 | 7/2011 | Loopstra et al. |
| 2012/0050709 A1 | 3/2012 | Van Der Pasch et al. |
| 2012/0154774 A1* | 6/2012 | Van Der Wijst ........ G03F 7/708 355/53 |
| 2013/0050670 A1* | 2/2013 | Koenen ................ H01L 23/544 355/67 |

FOREIGN PATENT DOCUMENTS

| | | |
|---|---|---|
| CN | 101030042 | 9/2007 |
| CN | 102385255 | 3/2012 |
| DE | 102011075393 | 11/2012 |
| EP | 1 643 543 | 4/2006 |
| JP | 2000-58421 | 2/2000 |
| JP | 2007-258695 | 10/2007 |
| JP | 2007-318119 | 12/2007 |
| JP | 2009-94253 | 4/2009 |
| JP | 2009-130354 | 6/2009 |
| JP | 2009-283790 | 12/2009 |
| JP | 2010-153854 | 7/2010 |
| JP | 2010-219558 | 9/2010 |
| JP | 2012-504328 | 2/2012 |
| KR | 10-2006-0026883 | 3/2006 |
| WO | 2005/006416 | 1/2005 |

OTHER PUBLICATIONS

Japanese Office Action dated Jul. 14, 2015 in Japanese Patent Application No. 2015-507429.
International Search Report dated Jun. 19, 2013 in corresponding International Patent Application No. PCT/EP2013/055537.
Jan Holterman et al., "Active Damping Based on Decoupled Collocated Control," IEEE/ASME Transactions on Mechatronics, vol. 10, No. 2, pp. 135-145 (Apr. 2005).
Chinese Office Action dated May 5, 2016 in corresponding Chinese Patent Application No. 201380022023.6 (9 pages).
Japanese Office Action dated Dec. 19, 2016 in corresponding Japanese Patent Application No. 2016-039827 (4 pages).
Korean Office Action dated Apr. 27, 2017 in corresponding Korean Patent Application No. 10-2017-7005092 (11 pages).

* cited by examiner

Fig. 4 ial applications 61/638,889, which was filed on Apr. 26, 2012, and which is incorporated herein in its entirety by reference.

FIELD

The present invention relates to a lithography apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Accurate control of the relative position and/or orientation of various elements of the lithography apparatus is desirable to ensure high performance (e.g. accurate overlay). Vibrations can interfere with such control by reducing the accuracy of the measurements and/or by causing undesirable movement of the body to be controlled. Encoder systems may be used for performing the position and/or orientation measurement. A sensor part on one body may be configured to detect radiation reflected from a pattern or grid on another body (which may be referred to as a reference part). Interferometry may be used. Vibrations of the sensor part or the reflective body can reduce the accuracy of the measurements.

A measurement system (e.g. encoder system) may be used for measuring the position and/or orientation of the substrate, of a pattern formed on the substrate, or of the substrate table relative to a reference frame. The measurement system may comprise an alignment sensor or a level sensor or both. In this context the reference frame is sometimes referred to as a "metroframe". A plate comprising a grid (sometimes referred to as a "gridplate") may be attached to the metroframe with the sensor part being attached to the substrate table or vice versa. For reasons of productivity it may be desirable to use substrates that are larger than the substrates that have been most commonly used previously, for example substrates having diameters of 450 mm or more, rather than 300 mm or less. Such substrates require substrate tables, metroframes and gridplates that are larger laterally (i.e. in directions parallel to the plane of the substrate). In order to maintain sufficient stiffness in the laterally larger gridplate, the gridplate may need to be made thicker. However, the amount of space available in the thickness direction (perpendicular to the plane of the substrate) may be limited. The reference frame may therefore have to be made thinner to accommodate the thicker gridplate.

Increasing the lateral size of the reference frame and decreasing the thickness of the reference frame will tend to reduce the frequencies of the natural internal modes of vibration or resonance (also referred to as the "eigenfrequencies") of the reference frame. Lower eigenfrequencies may favor vibrations that are more problematic for measurement systems that interact with the reference frame. It has been proposed previously to use a plurality of smaller reference frames rather than a single reference frame to make internal eigenfrequencies higher. However, smaller reference frames are lighter and more easily accelerated, and therefore displaced, which may also lead to errors in position control.

SUMMARY

It is desirable to improve the accuracy of position and/or orientation control of elements of the lithography apparatus.

According to an embodiment, there is provided a lithography apparatus comprising: a support stage; and a measurement system comprising a sensor part and a reference part, the measurement system being configured to determine the position and/or orientation of the support stage, or of a component mounted on the support stage, relative to a reference frame by using the sensor part to interact with the reference part, wherein: the reference frame comprises N sub-frames coupled together so as to behave predominantly as a single rigid body with respect to vibrations below a first reference frequency and predominantly as an N-body system with respect to vibrations above a second reference frequency, where N is an integer greater than 1.

According to an embodiment, there is provided a device manufacturing method, comprising: providing a support stage for a lithography apparatus; and using a measurement system comprising a sensor part and a reference part to determine the position and/or orientation of the support stage, or of a component mounted on the support stage, relative to a reference frame by using the sensor part to interact with the reference part, wherein: the reference frame comprises N sub-frames coupled together so as to behave predominantly as a single rigid body with respect to vibrations below a first reference frequency and predominantly as an N-body system with respect to vibrations above a second reference frequency, where N is an integer greater than 1.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
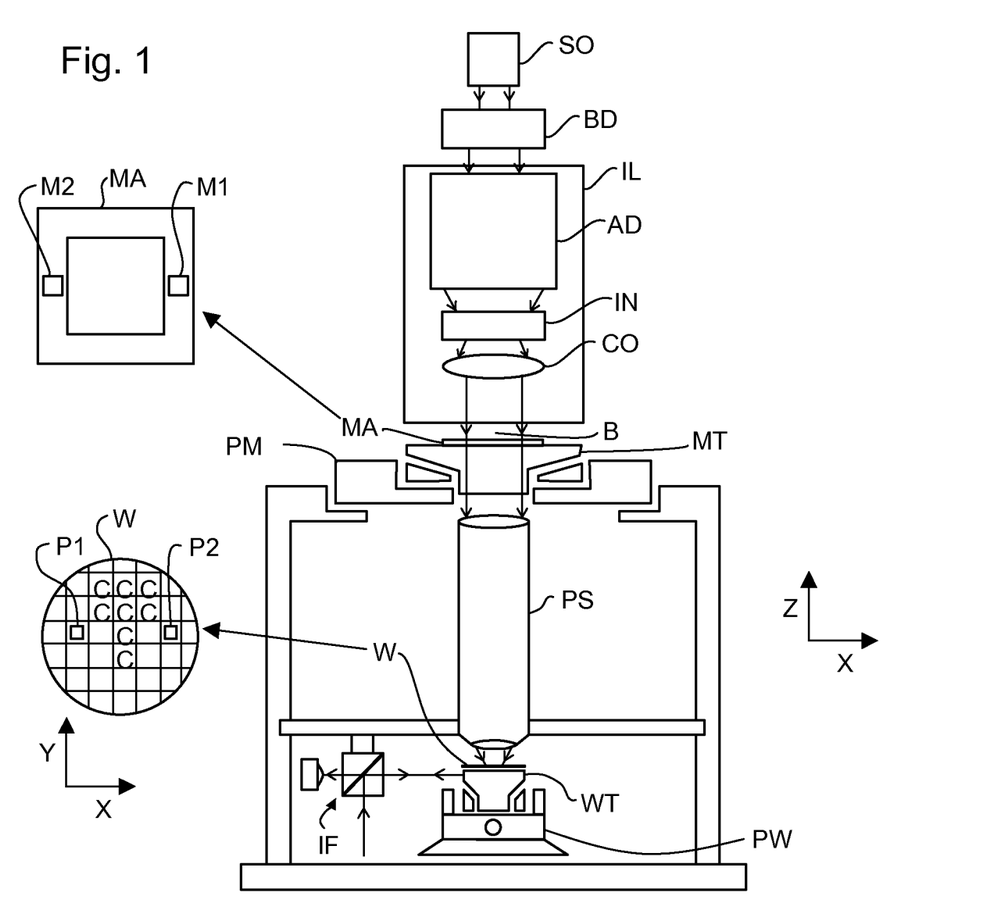
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device.

Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a patterning device library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

As discussed above, measurements of the position and/or orientation of elements of the lithography apparatus may be performed by reflecting radiation from components connected to a reference frame. Where the reference frame has relatively low internal eigenfrequencies, vibrational noise reaching the reference frame from typical lithography processes may interfere with the measurements, reducing their accuracy. It has been proposed in this context to split a reference frame into a plurality of sub-frames but this reduces the weight of each sub-frame. Reducing the weight of each sub-frame makes each sub-frame easier to accelerate, thus tending to increase positioning errors caused by disturbance forces reaching the sub-frames.

According to an embodiment, the reference frame is split into N sub-frames and the N sub-frames are coupled together in such a way that the N sub-frames behave predominantly as a single rigid body with respect to vibrations below a first reference frequency and predominantly as an N-body system with respect to vibrations above a second reference frequency.

The inventors have recognized that the vibrations typically present in a lithography apparatus that would have amplitudes sufficiently large to cause problematic deviations in the position and/or orientation of the reference frame are generally of relatively low frequency. For example, pressure waves due to movement of the substrate table during scanning may provide a source of vibration having frequencies in the order of 10 Hz. By arranging for the coupling between the N sub-frames to be very stiff at these frequencies, so that the N sub-frames behave as a single rigid body, the N sub-frames have a large effective mass and cannot be accelerated easily. Position and/or orientation errors caused by these low frequency vibrations are thus minimized. At the same time, the coupling is arranged so that at higher frequencies the N sub-frames behave as an N-body system. In an embodiment, each of the N sub-frames is substantially decoupled from the other sub-frames at such frequencies. In this way, the dominant internal resonant frequencies or eigenfrequencies of the reference frame are at the same frequencies as the eigenfrequencies of the individual isolated sub-frames. Because the dimensions of the sub-frames are smaller than the dimensions of the reference frame as a whole, the eigenfrequencies are higher than the eigenfrequencies that would be associated with the reference frame if all of the N sub-frames were connected integrally together (so that the N sub-frames behave as a single rigid body for all frequencies). Increasing the eigenfrequencies reduces the extent to which the reference frame will vibrate at frequencies that are problematic for measurements of position and/or orientation using the reference frame.

In an embodiment, the reference frame is used as the basis for measurements of the position and/or orientation of a support stage (or of a component, or of a pattern formed on a component, mounted on the support stage). In an embodiment, the support stage is a substrate table constructed and arranged to support a substrate, a mask table constructed and arranged to support a patterning device, or an optical element support constructed and arranged to hold an optical element, for example an optical element of the projection system. The substrate, patterning device and optical element are thus examples of components that could be mounted on the support stage. Where reference is made below to determining the position and/or orientation of the support stage, this is to be understood as encompassing determining the position and/or orientation of components mounted on the support stage and/or of patterns formed on the components.

In an embodiment, measurement of the position and/or orientation of the support stage relative to the reference frame is used to determine the position and/or orientation of the support stage relative to further component of the lithography system. In an embodiment, this is achieved by performing the further procedure of measuring the position and/or orientation of the further component relative to the same reference frame. In an embodiment, the support stage is a substrate table and the further component is the projection system.

Figure 2:
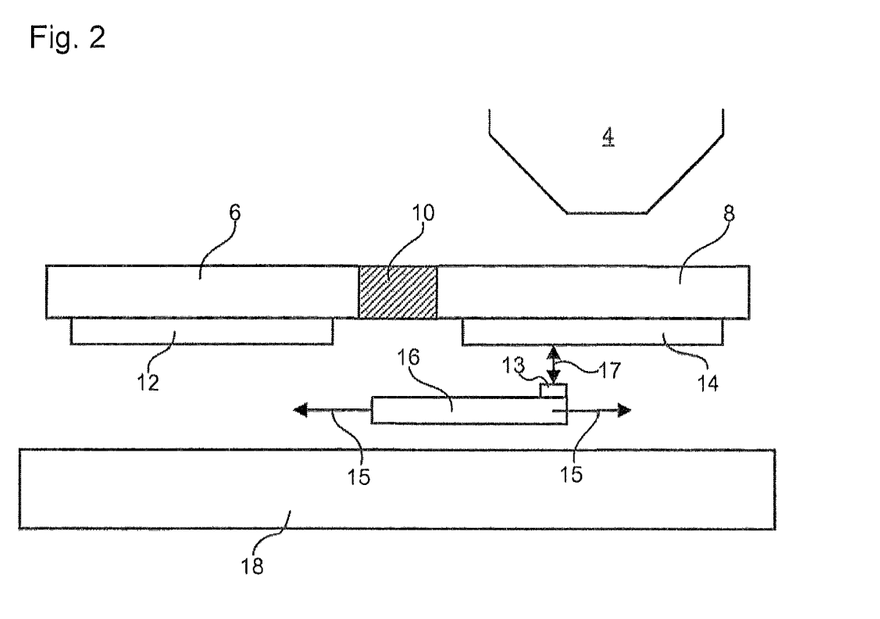
FIG. 2 depicts a lithography apparatus comprising a reference frame having two sub-frames and a coupling system for dynamically coupling the sub-frames according to an embodiment of the invention.

FIG. 2 illustrates an example configuration in which a reference frame 6,8 is used for measuring the position and/or orientation of a substrate and/or substrate table 16. Here, the substrate table 16 is configured to be scanned (arrows 15) in an X-Y plane relative to a reference frame 6,8. In an embodiment the reference frame 6,8 is mechanically isolated relative to the surrounding environment and/or a base frame 18 by a vibration isolation system (not shown). In an embodiment the substrate table 16 is levitated above the base frame 18 using planar motors. In an embodiment, the substrate table 16 is configured to be moved between various positions underneath a projection system 4 and/or to a position at which metrology measurements can be made, which may not necessarily be underneath the projection system 4.

In an embodiment, a measurement system (e.g. an encoder system) is provided for measuring the position and/or orientation of the substrate and/or substrate table 16. The measurement system comprises a sensor part 13 and a reference part 12,14. In the embodiment shown the sensor part 13 is mounted on the substrate table 16 and the reference part 12,14 is mounted on a reference frame 6,8. In other embodiments, the reference part is integral with the reference frame, rather than mounted on the reference frame. In other embodiments, the sensor part is mounted on the reference frame and the reference part is mounted on, or integral with, the substrate table. In an embodiment the reference part comprises a reference pattern or grid.

The sensor part 13 is configured to detect electromagnetic radiation 17 reflected from the reference part 12,14. The detected radiation is analyzed and used to determine, or contribute to a determination of, the position and/or orientation of the substrate or substrate table 16 relative to the reference frame 6,8.

The reference frame 6,8 is divided into a plurality, N, of sub-frames 6,8. In the example shown, N=2. The two sub-frames 6,8 are coupled together by a coupling system 10. The coupling system 10 is configured such that the sub-frames 6,8 behave predominantly as a single rigid body with respect to vibrations below a first reference frequency and predominantly as a two body system with respect to vibrations above a second reference frequency. In this way, as discussed above, the reference frame 6,8 behaves as a heavy object for input vibrations at frequencies below the first reference frequency. The large inertia will oppose accelerations and limit displacement of the reference frame 6,8. In an embodiment, the first reference frequency is in the range of 15-60 Hz, preferably 30-50 Hz, and equal to or lower than the second reference frequency. In an embodiment, a majority of the power of vibrations arising due to the scanning motion of the substrate table 16 will be below the first reference frequency. Typically, such vibrations arise at frequencies around 10 Hz.

At the same time, the internal resonant modes or eigenfrequencies of the reference frame 6,8 are predominantly determined by the internal resonant modes or eigenfrequencies of the individual sub-frames above the second reference frequency because the sub-frames behave as separate sub-frames above the second reference frequency. In an embodiment, the second reference frequency is in the range of 15-60 Hz, for example 30-50 Hz in an embodiment of the invention, and equal to or higher than the first reference frequency. In an embodiment, the second reference frequency is below the main internal resonant frequencies or eigenfrequencies that would be associated with the reference frame if the coupling were entirely rigid at all frequencies. The eigenfrequencies of the reference frame 6,8 are thereby maintained relatively high and are thus less likely to interfere with measurements of the position and/or orientation of the substrate and/or substrate table 16.

In an example, dividing a reference frame into two equal parts causes the first (i.e. lowest) eigenfrequency to increase by a factor of 4. In such an arrangement it is expected that the impact on overlay errors due to excitation of the first eigenfrequency would be reduced by a factor of 16 relative to the case where the reference frame is not divided.

Figure 3:
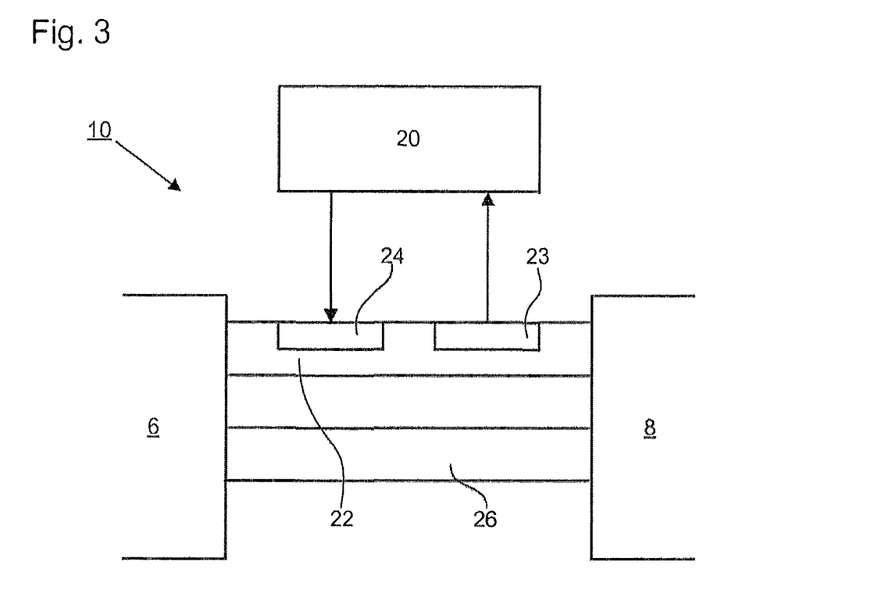
FIG. 3 depicts an example active coupling system comprising a force sensor according to an embodiment of the invention.
Figure 4:
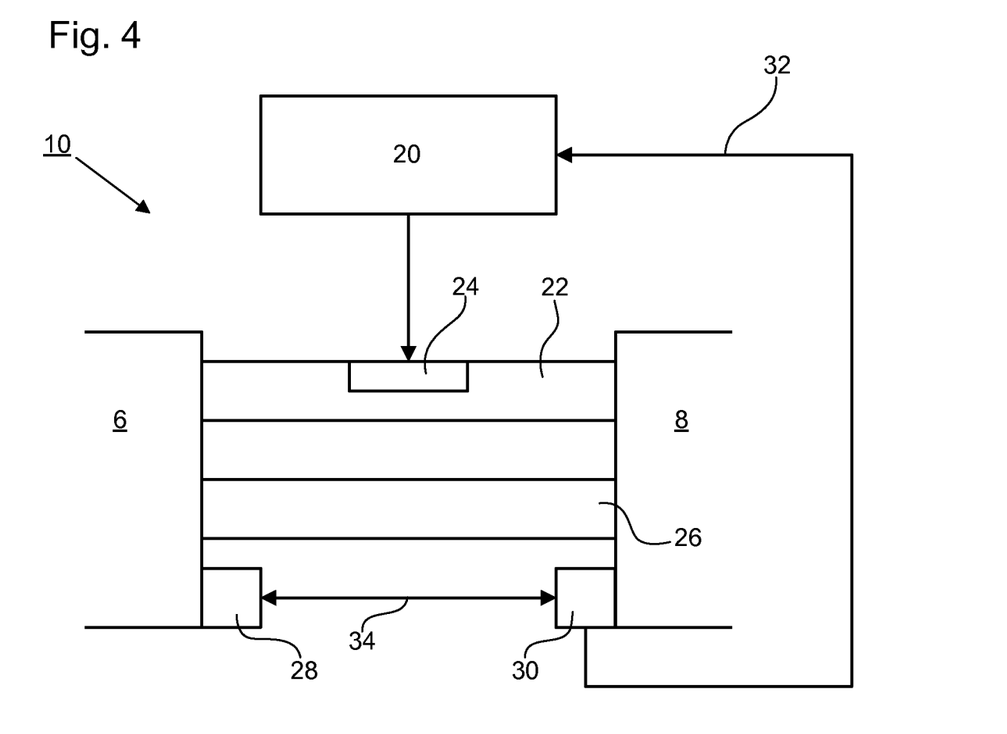
FIG. 4 depicts an example active coupling system comprising a movement sensor according to an embodiment of the invention.

In an embodiment, the coupling system 10 is "active". In such a system, the size of a damping force is controlled by reference to a measurement of the state of the reference frame. In an embodiment, the force, relative acceleration and/or relative velocity between different sub-frames is measured. FIGS. 3 and 4 depict examples of an active coupling system 10 for coupling a sub-frame 6 to a sub-frame 8.

In the example of FIG. 3, the coupling system 10 comprises a resilient member 26 and a damping member 22. In an example of such an embodiment the resilient member 26 is configured to deform elastically and provide a restoring force that increases as a function of the extent of deformation of the resilient member 26. In an embodiment the damping member 22 is configured to dissipate energy associated with deformation of the resilient member 26. In the embodiment shown, the resilient member 26 is provided as an element separate from the damping member 22. In other embodiments, the resilient member and damping member are provided as an integral unit.

A control system 20 may be provided for actively modulating operation of the coupling system 10. In the example shown in FIG. 3 the control system 20 controls the amount of damping force provided by the damping member 22. The control system 20 receives input from a force sensor 23. The force sensor 23 measures the relative force between the two sub-frames 6 and 8. The control system 20 provides a control signal to an input terminal 24 based on the measured force. The damping force provided by the coupling system 10 is varied according to the control signal supplied to the input terminal 24.

FIG. 4 depicts an alternative coupling system 10. The coupling system 10 of FIG. 4 corresponds to that shown in FIG. 3 except that a movement sensor 28,30 is provided instead of a force sensor. In an embodiment, the movement sensor 28,30 measures relative velocity or acceleration. In an embodiment, the movement sensor 28,30 comprises elements 28 and 30 that exchange electromagnetic radiation 34 (e.g. between an emitter and receiver, or between a emitter/sensor and reflective pattern or grid). The control system 20 receives input 32 from the movement sensor 28,30. A control signal is generated based on the input 32 and provided to the input terminal 24 of the damping member 22. The damping force provided by the coupling system 10 is varied according to the control signal.

The use of active damping may facilitate higher levels of damping than a purely passive system. However, the coupling system 10 may be configured to provide passive damping in conjunction with active damping or passive damping only. In an embodiment, passive damping is achieved by providing a damping material, such as a natural or synthetic rubber, in between different sub-frames.

In an embodiment, the damping force provided by the coupling system 10 is provided by one or more of the following: a piezo-electric element, a Lorentz actuator.

In the embodiments shown in FIGS. 3 and 4 the control system 20 is configured to control the operation of the damping member 22 and not the resilient member 26. In other embodiments, the control system 20 is configured to control the operation of both the damping member 22 and the resilient member 26. In still further embodiments, the control system 20 is configured to control the operation of the resilient member 26 only. In the detailed examples discussed above, the reference frame comprises two sub-frames only, with the coupling system acting only between these two sub-frames. In other embodiments the reference frame may be split into more than two sub-frames. In examples of such embodiments, the coupling system comprises a plurality of sub-systems, each sub-system acting between a different two of the plurality of sub-frames. In an embodiment, each sub-frame is identical. In an embodiment, each sub-system is identical. In other embodiments, the sub-frames differ from each other and/or the sub-systems differ from each other.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithography apparatus comprising:
a base frame;
a support stage movable relative to said base frame;
a reference frame separate from said base frame;
a coupling system, and
a measurement system comprising (a) N sensor parts and one or more reference parts or (b) N reference parts and one or more sensor parts, the measurement system being configured to determine the position and/or orientation of the support stage, or of a component mounted on the support stage, relative to the reference frame by using the N sensor parts or the N reference parts to interact respectively with the one or more reference parts or the one or more sensor parts, wherein:
the N sensor parts of the measurement system are mounted to respective N sub-frames and the one or more reference parts are mounted to the support stage, or the N reference parts of the measurement system are mounted to the respective N sub-frames and the one or more sensor parts are mounted to the support stage,
the reference frame comprises said N sub-frames, which are coupled together by the coupling system, the coupling system providing the coupling between the N sub-frames and including a part that extends between two adjacent sub-frames of the N sub-frames that are located in a same plane so as to attach said two adjacent sub-frames of the N sub-frames to each other so that the reference frame behaves as a single rigid body with respect to vibrations below a first reference frequency and as an N-body system with respect to vibrations above a second reference frequency, where N is an integer greater than 1.

2. An apparatus according to claim 1, wherein:
either 1) the one or more sensor parts are fixedly mounted to the support stage or the component mounted on the support stage and the N reference parts are fixedly mounted to, or integral with, the reference frame; or 2) the one or more reference parts are fixedly mounted to, or integral with, the support stage or the component mounted on the support stage and the N sensor parts are fixedly mounted to the reference frame.

3. An apparatus according to claim 1, wherein:
the first reference frequency is in the range 15-60 Hz and is equal to or lower than the second reference frequency.

4. An apparatus according to claim 1, wherein:
the second reference frequency is in the range 15-60 Hz and is equal to or higher than the first reference frequency.

5. An apparatus according to claim 1, wherein N=2.

6. An apparatus according to claim 1, further comprising:
a patterning device for providing a patterned radiation beam;
a projection system configured to project the patterned radiation beam onto a substrate, wherein:
the support stage is configured to support one of the following: the substrate; the patterning device; an optical element of the projection system.

7. An apparatus according to claim 6, wherein the first reference frequency is higher than a maximum frequency at which the support stage for the substrate is scannable by the lithography apparatus.

8. An apparatus according to claim 1, configured to determine the position and/or orientation of the support stage, or of a component mounted on the support stage, relative to a further component of the lithography apparatus by combining 1) a determination of the position and/or orientation of the support stage, or of a component mounted on the support stage, relative to the reference frame with 2) a determination of the position and/or orientation of the further component relative to the same reference frame.

9. An apparatus according to claim 8, wherein the support stage is a substrate table for holding a substrate onto which a patterned radiation beam is to be projected by a projection system, and the further component is the projection system or a component thereof.

10. An apparatus according to claim 1, wherein the coupling system is active.

11. An apparatus according to claim 10, wherein the coupling system comprises a force sensor for measuring the relative force between two of the plurality of N sub-frames and a controller configured to adapt the coupling between the two sub-frames based on the output from the force sensor.

12. An apparatus according to claim 10, wherein the coupling system comprises a movement sensor for measuring the relative movement between two of the plurality of N sub-frames and a controller configured to adapt the coupling between the two sub-frames based on the output from the movement sensor.

13. An apparatus according to claim 10, wherein the coupling system comprises a resilient member configured to provide an elastic restoring force and a damping member configured to dissipate energy.

14. An apparatus according to claim 13, wherein the coupling system is configured to change the behavior of either or both of the resilient member and the damping member in order to perform the adaption of the coupling between the two sub-frames.

15. An apparatus according to claim 1, wherein the coupling system is passive.

16. An apparatus according to claim 1, wherein the interaction between the N sensor parts and the N reference parts comprises detecting radiation reflected from the N reference parts.

17. An apparatus according to claim 1, wherein the measurement system is configured to determine the position and/or orientation of the support stage relative to a first of the N sub-frames when the support stage is at a first location and to determine the position and/or orientation of the support stage relative to a second of the N sub-frames when the support stage is at a second location that is different from the first location.

18. An apparatus according to claim 1, wherein each of the N sub-frames is arranged in a same plane.

19. A device manufacturing method, comprising:
providing a support stage for a lithography apparatus including a base frame, the support stage movable relative to the base frame; and
using a measurement system comprising (a) N sensor parts and one or more reference parts or (b) N reference parts and one or more sensor parts to determine the position and/or orientation of the support stage, or of a component mounted on the support stage, relative to a reference frame separate from said base frame by using the N sensor parts or the N reference parts to interact respectively with the one or more reference parts or the one or more sensor parts, wherein:
the N sensor parts of the measurement system are mounted to respective N sub-frames and the one or more reference parts are mounted to the support stage, or the N reference parts of the measurement system are mounted to the respective N sub-frames and the one or more sensor parts are mounted to the support stage, and
the reference frame comprises said N sub-frames, which are coupled together by a coupling system, the coupling system providing the coupling between the N sub-frames and including a part that extends between two adjacent sub-frames of the N sub-frames that are located in a same plane so as to attach said two adjacent sub-frames of the N sub-frames to each other so that the reference frame behaves as a single rigid body with respect to vibrations below a first reference frequency and as an N-body system with respect to vibrations above a second reference frequency, where N is an integer greater than 1.

20. A device manufacturing method according to claim 19, wherein the using comprises determining the position and/or orientation of the support stage relative to a first of the N sub-frames when the support stage is at a first location and determining the position and/or orientation of the support stage relative to a second of the N sub-frames when the support stage is at a second location, the first location being different from the second location.

* * * * *